US012777930B2

(12) United States Patent
Hu et al.

(10) Patent No.: US 12,777,930 B2
(45) Date of Patent: Oct. 27, 2026

(54) FLEXIBLE THERMAL INTERFACE BASED ON SELF-ASSEMBLED BORON ARSENIDE FOR HIGH-PERFORMANCE THERMAL MANAGEMENT

(71) Applicant: The Regents of the University of California, Oakland, CA (US)

(72) Inventors: Yongjie Hu, Los Angeles, CA (US); Ying Cui, Los Angeles, CA (US)

( * ) Notice: Subject to any disclaimer, the term of this patent is extended or adjusted under 35 U.S.C. 154(b) by 581 days.

(21) Appl. No.: 18/264,571

(22) PCT Filed: Feb. 4, 2022

(86) PCT No.: PCT/US2022/015343
§ 371 (c)(1),
(2) Date: Aug. 7, 2023

(87) PCT Pub. No.: WO2022/170115
PCT Pub. Date: Aug. 11, 2022

(65) Prior Publication Data
US 2024/0055320 A1 Feb. 15, 2024

Related U.S. Application Data

(60) Provisional application No. 63/147,053, filed on Feb. 8, 2021.

(51) Int. Cl.
*H10W 40/25* (2026.01)
*C09K 5/14* (2006.01)

(52) U.S. Cl.
CPC ............. *H10W 40/255* (2026.01); *C09K 5/14* (2013.01)

(58) Field of Classification Search
CPC . H10W 40/255; H10W 40/251; H10W 40/70; C09K 5/14; H10H 20/8581; C30B 7/04; C30B 7/08; C30B 29/40; G06F 1/20; C08K 3/38; C08K 2201/001; C08L 101/00
See application file for complete search history.

(56) References Cited

U.S. PATENT DOCUMENTS

| | | | | |
|---|---|---|---|---|
| 5,232,970 | A * | 8/1993 | Solc | C08L 77/06 524/404 |
| 2015/0362265 | A1 | 12/2015 | Broido et al. | |
| 2021/0035885 | A1 * | 2/2021 | Hu | H10P 14/3421 |

FOREIGN PATENT DOCUMENTS

WO WO-2018/236847 A1 12/2018

OTHER PUBLICATIONS

Han et al., "An Anisotropically High Thermal Conductive Boron Nitride/Epoxy Composite Based on Nacre-Mimetic 3D Network", Advanced Functional Materials, vol. 29, article 1900412, Feb. 6, 2012, p. 1-9.

International Search Report and Written Opinion on PCT PCT/US2022/015343 dated Apr. 27, 2022 (11 pages).

* cited by examiner

*Primary Examiner* — Cephia D Toomer
(74) *Attorney, Agent, or Firm* — Foley & Lardner LLP

(57) ABSTRACT

A thermal interface comprising a polymer composite comprising a polymer and a self-assembled boron arsenide.

16 Claims, 4 Drawing Sheets

FLEXIBLE THERMAL INTERFACE BASED ON SELF-ASSEMBLED BORON ARSENIDE FOR HIGH-PERFORMANCE THERMAL MANAGEMENT

CROSS REFERENCE TO RELATED APPLICATIONS

This application is a U.S. National Phase Application under 35 U.S.C. § 371 of International Application No. PCT/US2022/015343, filed on Feb. 4, 2022, and which claims the benefit of priority to U.S. Provisional Patent Application No. 63/147,053 filed Feb. 8, 2021, which are hereby incorporated by reference, in their entirety for any and all purposes.

STATEMENT OF GOVERNMENT INTEREST

This invention was made with government support under 1753393 awarded by the National Science Foundation. The government has certain rights in the invention.

TECHNICAL FIELD

The present technology is generally related to thermal management and more particularly to a flexible thermal interface based on self-assembled Boron Arsenide for high-performance thermal management.

BACKGROUND

Hierarchical electronic systems ranging from nanoscale transistors, smart phones, laptops, vehicle electronics, to data server farms, waste heat dissipates from the hot spots to heat sink across a series of thermal resistance of multiple device layers and their interfaces. As a result, the device performance, reliability, and energy efficiency can be strongly degraded by a large thermal resistance and a rising hot spot temperature. To address this challenge, recent key research focus for thermal management aims to develop thermal interfaces that enhances thermal coupling and minimize thermal resistance between heterogeneous components. During the last decades, varied categories including thermal greases, gels, pads, tapes, conductive adhesives, phase change materials, metallic solders have been devoted. Fundamentally, there is tradeoff between high thermal conductivity and soft mechanics. Strongly bonded materials such as ceramics and dielectrics usually give high thermal conductivity, however their rigid structures (elastic modulus of approximately 1 GPa) can potentially lead to performance degradation like mechanical pump-out, delamination, cracking, and void formation. On the other hand, soft materials such as polymers can provide effective interface contact but are usually limited by an intrinsically low thermal conductivity of approximately 0.2 W/m·K. Despite many exciting progress, high-performance thermal interfaces with the combination of low elastic modulus, large flexibility, and high thermal conductivity have remained to be demonstrated.

SUMMARY

According to certain aspects, the present disclosure relates to a record-high performance thermal interface beyond the current state of the art, based on self-assembled manufacturing of cubic boron arsenide (s-BAs). The s-BAs exhibits highly desirable characteristics of high thermal conductivity up to 21 W/m·K and excellent elastic compliance similar to that of soft biological tissues down to 100 kPa through the rational design of BAs microcrystals in polymer composite. In addition, the s-BAs demonstrates high flexibility and preserves the high conductivity over at least 500 bending cycles, opening up new application opportunities for flexible thermal cooling. Moreover, device integration with power LEDs according to embodiments were demonstrated and measured a superior cooling performance of s-BAs beyond the current state of the art, by up to 45° C. reduction in the hot spot temperature. Together, the present disclosure demonstrates scalable manufacturing of a new generation of energy-efficient and flexible thermal interface that holds great promise for advanced thermal management of future integrated circuits and emerging applications such as wearable electronics and soft robotics.

According to further aspects, because the high performance of flexible thermal interface based on self-assembled boron arsenide was realized for the first time, the present embodiments include broad applications: (1) All the materials preparation, materials processing and self-assembled manufacturing of cubic boron arsenide (s-BAs and etc., and (2) all applications as a new materials or device platform for all applications in electronics, robotics, sensors, detectors etc. This new material system is expected to play significant role in modern technologies.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 1*a* is a schematic illustration of a typical thermal interface applied in electronics packagings. Heat dissipation from the chip to the heat sink is via the thermal interface that is unusually limited by the thermal interface and the resulted thermal boundary resistance (TBR).[33] FIG. 1*b* is a performance comparison of self-assembled boron arsenide vs. the state of the art, where the arrow indicates the design goal of high performance thermal interfaces to achieve both low elastic modulus and low thermal resistivity (i.e. high κ). FIG. 1*c* is a schematic of a zinc-blend crystal structure of cubic barium arsenide (BAs) and its high-resolution transmission electron microscopy (TEM) image showing atomically resolved lattices. The arrow indicates the crystal direction of the (202) plane. FIG. 1*d* is a thermal conductivity distribution diagram for different materials, including typical fillers.

FIG. 2*a* is a schematic illustrating the self-assembly process through freezing-drying of BAs suspensions to form aligned BAs pillars and polymetric composites. FIG. 2*b* are scanning electron microscope (SEM) images of as-synthesized BAs crystals, where the insert indicates the crystal size distribution. FIG. 2*c* is a cross-sectional SEM image of s-BAs, verifying an aligned lamellar structure. FIG. 2*d* is an optical image of an inch-size s-BAs sample. FIG. 2*e* is a graph of a laser flash measurement of the s-BAs samples with different BAs loading ratios. FIG. 2*f* is a thermal conductivity graph of s-BAs with different BAs loadings, where the red symbols are experimental data, and the pink shadowed background represents the modeling results considering varied extents of alignment.

FIGS. 3*a-c* are representative stress-strain experimental curves for (*a*) Young's modulus, (*b*) shear modulus measurements, with varied loading ratios, and (*c*) Young's modulus and shear modulus of s-BAs, where the solid symbols are experimental data, and the shadowed backgrounds represent the modeling results considering varied extents of alignment. FIG. 3*d* is an optical image of the highly flexible s-BAs, where the inset on the bottom left, indicates the original size. FIG. 3*e* shows bending tests and thermal conductivity measurement of s-BAs in response to the cyclic bending.

FIG. 4*a* is an optical image of an LED, and FIG. 4*b* is a schematic illustration of its integration with a thermal interface and heat sink. FIG. 4*c* is a series of time-dependent infrared images of the light emitting device (LED) integrated with different materials (thermal epoxy, silicone thermal pad, and s-BAs), indicating temperature distributions near the hot spot. FIG. 4*d* is a graphic comparison of the LED hot spot temperatures using different thermal interface materials.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Introduction

As set forth above, heat dissipation has been a critical technology challenge for modern electronics for decades.[1-7] With information technology ramping up in an increasingly digitized world, electronics cooling is scaling up rapidly in its impact on global energy consumption.[8,9] For instance, current data centers consume over 200 terawatt-hours of electricity annually but more than 50% of the total electricity is used simply for cooling process instead of for storage or computing.[10-11] In all hierarchical electronic systems such as nanoscale transistors, smart phones, laptops, vehicle electronics, and data server farms, waste heat dissipates from the hot spots to heat sinks across a series of thermal resistance of multiple device layers and their interfaces. As a result, the device performance, reliability, and energy efficiency can be strongly degraded by a large thermal resistance and a rising hot spot temperature. To address this challenge, recent key research focus for thermal management aims to develop thermal interfaces that enhances thermal coupling and minimize thermal resistance between heterogeneous components.[10]

Figure 1:
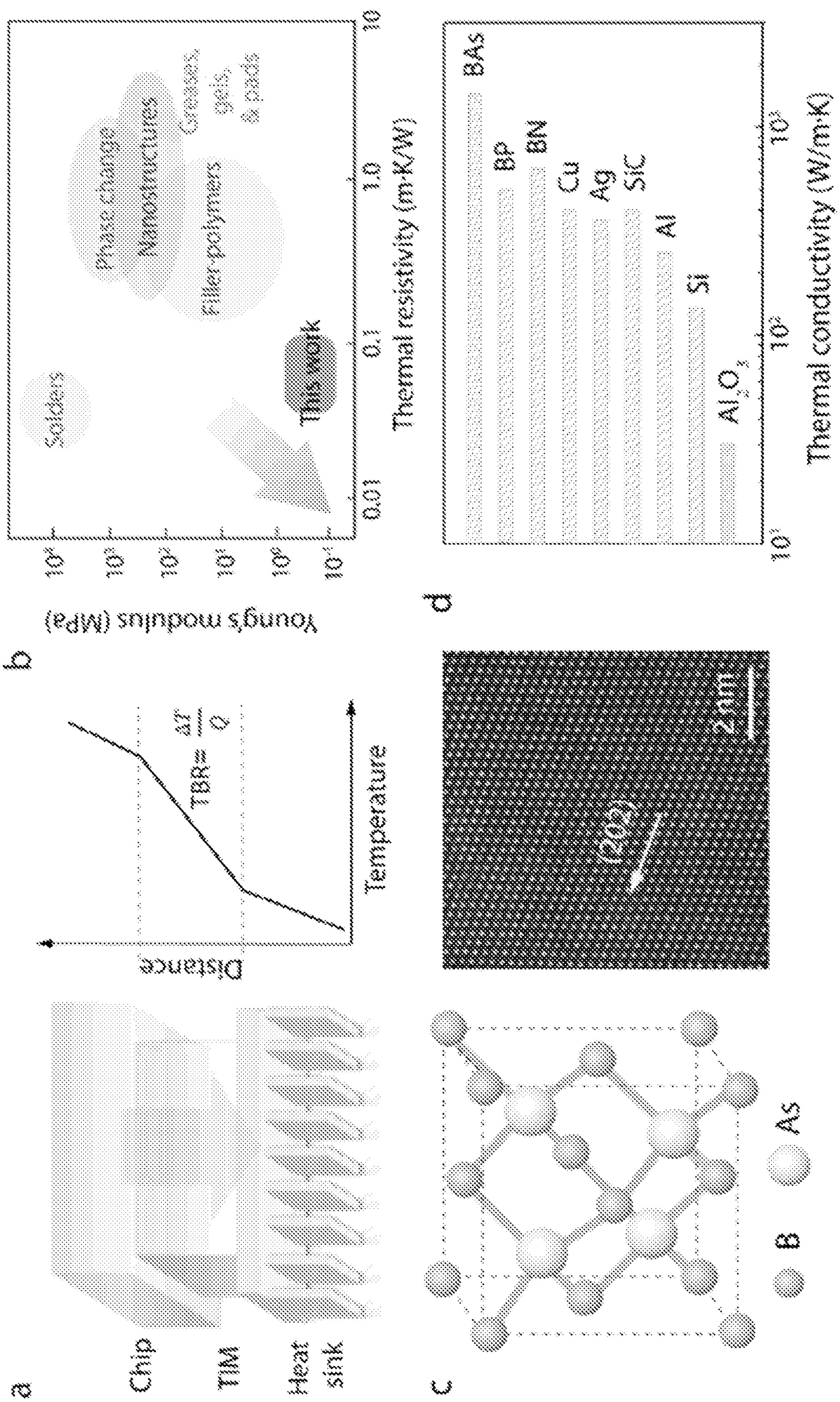
FIG. 1 is a series of illustrations regarding a high-performance thermal interface based on self-assembled boron arsenide to enhance heat dissipation.

In general, high performance thermal interfaces require both high thermal conductivity (κ) and low elastic modulus (E). When inserted between an electronics layer and a heat sink (FIG. 1*a*), high conductivity (κ) minimizes thermal resistance and enhances heat dissipation; where low elastic modulus (E) enables good surface compliance, thermal contact area, and thermomechanical stability. Current commercial thermal interfaces, however are usually limited by a low κ of approximately 1 W/mK, or high E of approximately 1 GPa, which largely constrains the cooling performance. In addition, emerging applications like wearable electronics and soft robotics require their thermal interfaces to be soft and flexible, but these have yet to be explored.[12-14]

In one aspect, a thermal interface includes a polymer composite comprising a polymer and a self-assembled boron arsenide. The polymer may be any of a wide variety of polymers including thermoplastic and thermoset polymers, elastomers, epoxies, silicones, and the like. In some embodiments, the polymer is a thermoplastic or thermoset polymer. In other embodiments the polymer includes an elastomer, an epoxy, a silicone, a rubber, a polyolefin, a polyacrylate, a polymethacrylate, a polyurethane, a polyketone, a polyacetylene, a polyvinylalcohol, a polyvinyl chloride, polyethylene, polyester, nylon, and a perfluorinatedpolyethylene (Teflon).

As will be discuss in more detail below, the polymer composites exhibit one or more of superior thermal conductivity, elastic modulus, Young's modulus, shear modulus, mechanical compliance, yield strength, tensile strength, ductility, toughness, elongation, and the like. For example, the thermal interface may exhibit a thermal conductivity of greater than about 1 W $m^{-1}K^{-1}$. This may include a thermal conductivity from about 1 W $m^{-1}K^{-1}$ to about 50 W $m^{-1}K^{-1}$ from about 1 W $m^{-1}K^{-1}$ to about 25 W $m^{-1}K^{-1}$ from about 1 W $m^{-1}K^{-1}$ to about 20 W $m^{-1}K^{-1}$, or from about 1 W $m^{-1}K^{-1}$ to about 10 W $m^{-1}K^{-1}$.

The thermal interface may also exhibit an elastic modulus of greater than about 90 kPa. This may include an elastic modulus from about 90 kPa to about 5 GPa, from about 90 kPa to about 2 GPa, from about 95 kPa to about 1 GPa, or from about 95 kPa to about 500 kPa.

The thermal interface may exhibit a shear modulus from about 40 kPa to about 200 kPa, according to ASTM E143. This may include a shear modulus from about 40 kPa to about 150 kPa.

The thermal interface may exhibit a Young's modulus from about 75 kPa to about 400 kPa, according to ASTM E111. This may include a Young's modulus from about 80 kPa to about 300 kPa.

The thermal interface may built into any sort of device that requires heat transfer and/or malleability of the interface to conform to any shape or size. Accordingly, in another aspect, a device is provide that includes a chip, a heat sink, and thermal interface comprising a polymeric composite of a polymer and a self-assembled boron arsenide.

The polymer of the device may be any of a wide variety of polymers including thermoplastic and thermoset polymers, elastomers, epoxies, silicones, and the like. In some embodiments, the polymer is a thermoplastic or thermoset polymer. In other embodiments the polymer includes an elastomer, an epoxy, a silicone, a rubber, a polyolefin, a polyacrylate, a polymethacrylate, a polyurethane, a polyketone, a polyacetylene, a polyvinylalcohol, a polyvinyl chloride, polyethylene, polyester, nylon, and a perfluorinated-polyethylene (Teflon).

As will be discuss in more detail below, the polymer composites of the device will exhibit one or more of superior thermal conductivity, elastic modulus, Young's modulus, shear modulus, mechanical compliance, yield strength, tensile strength, ductility, toughness, elongation, and the like. For example, the thermal interface may exhibit a thermal conductivity of greater than about 1 W $m^{-1}K^{-1}$. This may include a thermal conductivity from about 1 W $m^{-1}K^{-1}$ to about 50 W $m^{-1}K^{-1}$, from about 1 W $m^{-1}K^{-1}$ to about 25 W $m^{-1}K^{-1}$, from about 1 W $m^{-1}K^{-1}$ to about 20 W $m^{-1}K^{-1}$, or from about 1 W $m^{-1}K^{-1}$ to about 10 W $m^{-1}K^{-1}$.

The thermal interface of the device may also exhibit an elastic modulus of greater than about 90 kPa. This may include an elastic modulus from about 90 kPa to about 5 GPa, from about 90 kPa to about 2 GPa, from about 95 kPa to about 1 GPa, or from about 95 kPa to about 500 kPa.

The thermal interface may exhibit a shear modulus from about 40 kPa to about 200 kPa, according to ASTM E143. This may include a shear modulus from about 40 kPa to about 150 kPa.

The thermal interface may exhibit a Young's modulus from about 75 kPa to about 400 kPa, according to ASTM E111. This may include a Young's modulus from about 80 kPa to about 300 kPa.

A process of forming the a self-assembled boron arsenide polymer composites is also provided. Accordingly, in another aspect, a process includes suspending boron arsenide particles in water as a slurry in a mold, applying a directional temperature gradient to the mold to freeze the slurry as a frozen slurry, freeze-drying the frozen slurry to obtain a self-assembled boron arsenide material, and introducing a polymer melt to the self-assembled boron arsenide material to form the self-assembled boron arsenide polymer composite. In the method, the polymer melt includes a thermoplastic or thermoset polymer. In some embodiments, the polymer melt includes an elastomer, an epoxy, a silicone, nylon, polyethylene, polyester, or Teflon.

In another aspect, a thermal interface includes a self-assembled boron arsenide. And, a device may be fabricated that includes the thermal interface. Illustrative devices according to any embodiment herein include, but are not limited to, a transistor, a smart phone, a laptop, a vehicle electronic component, a data server, a wearable electronic, a sensor, a circuit, a memory module, a surgical assistance robot, a flexible exosuits robot, a collaborative robot, a bio-mimicry robot, flexible displayers, flexible circuits, folded phones and computers, LEDs, optoelectronics, printed circuit board, amplifier, capacitors, batteries, inductors, resistors, diodes, radio, television, phonographs, and radar applications.

Illustrative Examples And Discussion

Results and Discussion

During the last decades, intensive research efforts have been devoted to the use of a wide variety of interface technologies such as thermal greases, gels, pads, tapes, conductive adhesives, phase change materials, metallic solders, etc., with the understanding that different thermal interface materials may have their unique applications. The state of the art performance of thermal interfaces are summarized in FIG. 1B. Fundamentally, there is tradeoff between high thermal conductivity and soft mechanics.[15,16] Strongly bonded materials such as ceramics and dielectrics usually give high κ,[17] however, their rigid structures can potentially lead to performance degradation like mechanical pump-out, delamination, cracking, and void formation. On the other hand, soft materials such as polymers can provide effective interface contact but are usually limited by an intrinsically low κ of approximately 0.2 W/m·K.[18,19] For example, metal solder-based interfaces provide good thermal conductivity but their application are largely limited due to high E of approximately 1 GPa or above; in addition, solder systems are usually not applicable when electrical insulation is required. Nanostructures such as carbon nanotubes and metal nanowires have been applied to make compromise and improve the mechanical compliance.[20-23] Adhesives and gels possess good mechanical compliance, but usually exhibit a low thermal conductivity; their mixtures have been studied to make improvement over poor interfaces and weak van der Waals bonding.[16,24-24]

High-performance thermal interfaces with the combination of low elastic modulus, large flexibility, and high thermal conductivity have not been demonstrated to date.[16] In the meanwhile, thermal management has been calling on the development of new materials with ultra-high thermal conductivity.[27] Recently, building on ab initio theoretical calculations,[28-31] a new class of boron-based semiconductors,[3-7,32] including boron arsenide (BAs) and boron phosphide (BP), have been discovered exhibiting ultra-high thermal conductivity beyond most known heat conductors. See FIGS. 1*c* and 1*d*. In particular, cubic BAs have a record thermal conductivity that is greater than three times that of the industrial high conductivity standards such as copper and SiC, and twice as high as cubic boron nitride.[3,32]

Here we describe highly flexible thermal interfaces through self-assembled manufacturing of polymeric composites by taking advantage of the ultrahigh thermal conductivity of s-BAs crystals. As demonstrated through thermal and mechanical characterizations, the s-BAs thermal interface exhibits high performance with an unprecedented combination of thermal conductivity (κ of approximately 21 W/m·K), excellent elastic compliance similar to that of soft biological tissues (E of approximately 100 kPa), and high flexibility, all of which surpass the current state of the art and could lead to advanced thermal management of solid-state and flexible electronics.

To achieve high-performance, this disclosure first carefully examines the structural design of BAs particles to achieve efficient heat dissipation pathways. Structural optimization is important to the thermal conductivity of thermal interfaces. However, polymer matrices are generally soft to enable mechanical compliance, but their intrinsic low thermal conductivity (of approximately 0.2 W/m·K) could reduce the overall thermal conductivity. In particular, when high conductivity fillers are randomly distributed, heat transfer in the polymer could be significantly elongated, and, thereby, minimize the contribution from fillers.[16] In addition, organic-inorganic interfaces could result in thermal boundary resistance due to a mismatch in phonon spectra and density of states between heterogeneous components.[33-35] As a matter of fact, this explains why typical industrial thermal interfaces have a low conductivity around 1 W/m·K or below. To quantitatively evaluate the effect from structural design on the overall thermal conductivity, the present inventors have performed multiscale simulation to calculate the thermal conductivity of the composite materials with varying alignment of BAs fillers. The alignment is quantified by the standard deviation of distance (σ) from the BAs particles to the centerline of the alignment pillar, with σ approaches 0 for perfect alignment and increased σ for disorder.[36] A temperature gradient is applied across the structure to compute the volume-averaged heat flux density over the whole domain using finite element analysis. The effective thermal conductivities of s-BAs with varied extents of alignment are determined and plotted in FIG. 2*f*. The thermal conductivity and specific heat used in this simulation are all measured from experiment. The simulation results indicate that an effective design to achieve aligned fillers could effectively enhance the overall thermal conductivity of s-BAs.

Figure 2:
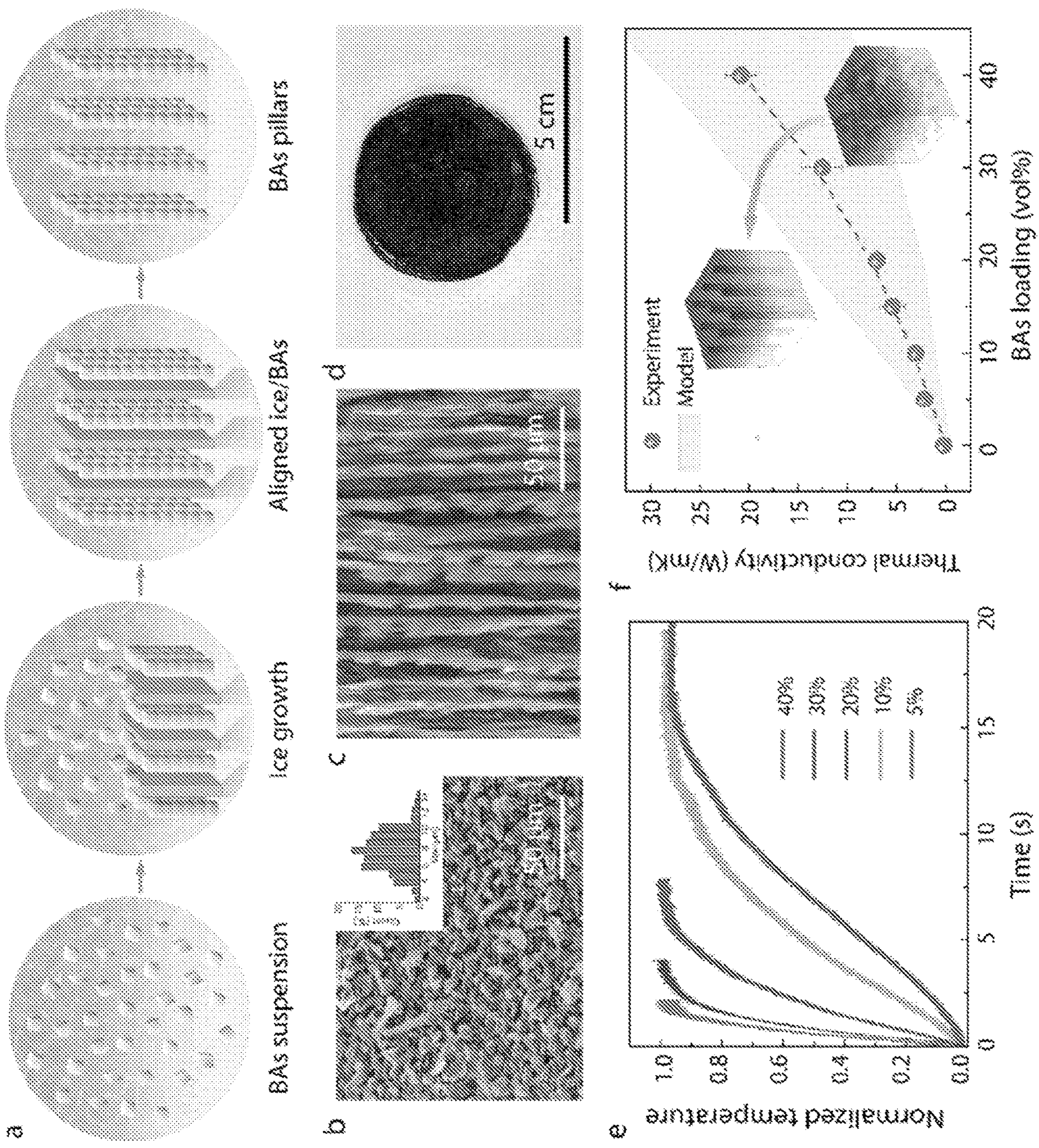
FIG. 2 is a series of illustrations regarding self-assembled manufacturing and thermal measurement of self-assembled boron arsenide (s-BAs).

To achieve rational alignment of BAs structures in the thermal interface, a self-assembled manufacturing method is disclosed using an ice-template process. FIG. 2*a*. First, BAs particles are dispersed in water to form an aqueous suspension. The BAs aqueous slurry was subsequently transferred into a tube mold. A directional temperature gradient (e.g., from a dry ice bath at the cold side to room temperature at the high temperature side) was applied across the mold that led the slurry to freeze. At the cold side, the nucleation of the ice crystals started and led to the formation of a super-cooled zone directly ahead of the growing ice front. Such an unstable region eventually resulted in perturbations, breaking the planar ice front into a columnar structure; consequently, ice crystals start to follow the temperature gradient direction to grow gradually into aligned lamellar pillars, driven by the growth of the ice template, BAs crystals are expelled and forced into assembled arrays to replicate the morphology and to fill the interspacing between the ice pillars. After this self-assembled process is complete, the material was dehydrated by freeze-drying, such that the aligned BAs structure was maintained. Thermodynamically, the freeze-drying process uses pressure and temperature below the equilibrium triple point in the phase diagram of water (i.e., 273.16 K and a partial vapor pressure of 611.657 Pa) to achieve sublimation of solid ice directly to vapor without going through a liquid phase, so that the structural distortion is minimized. Finally, a polymer melt was infiltrated into the BAs assembly and solidified to enhance the mechanical support and form composite s-BAs. The resulted structures were carefully verified by cross-sectional SEM images before (FIG. 2*b*) and after the assembly process (FIG. 2*c*), indicating that the aligned lamellar network of BAs pillars can be formed and well maintained during the process. Note, this manufacturing approach allows for preparation of inch-size s-BAs samples that amenable to further scaling (FIG. 2*d*).

The thermal conductivity of s-BAs was measured using laser flash methods. FIG. 2*e* illustrates a typical temperature rise curves for s-BAs with varied BAs volumetric loadings of 5%, 10%, 20%, 30%, and 40%, respectively. The measurements verify the high thermal conductivity of s-BAs (FIG. 2*f*). For example, the thermal conductivity of 21 W/m·K has been measured for a 40 vol % s-BAs, which represents an approximate 20 times enhancement over typical thermal epoxies and greases as industrial thermal interface standards. Consistent with the modeling design, the experimental results also show that the thermal conductivity of s-BAs is enhanced by greater than 400% through the self-assembled alignment versus random distribution. It was also found that the overall thermal conductivity of the assembled s-BAs is dominated by that of BAs fillers, regardless of the polymer matrix (elastomer, epoxy etc.). Taking a typical thermal interface thickness of 100 μm, this leads to a total thermal resistance of about 0.05 K·cm$^2$/W, which is below most literature reports. For example, traditional materials based on greases, adhesive, gels, and phase change materials typically yield a higher resistance from about 0.2-1, 0.15-1, 0.4-0.8, 0.3-0.7 K·cm$^2$/W, respectively.[24] Elastomic pads, silicone sheets, and thermal tapes typically have a total resistance of about 1-4 K·cm$^2$/W. The demonstrated performance of s-BAs high compared to other composites with various fillers including metals, ceramics, semiconductor, oxides, and nanomaterials.[16]

Figure 3:
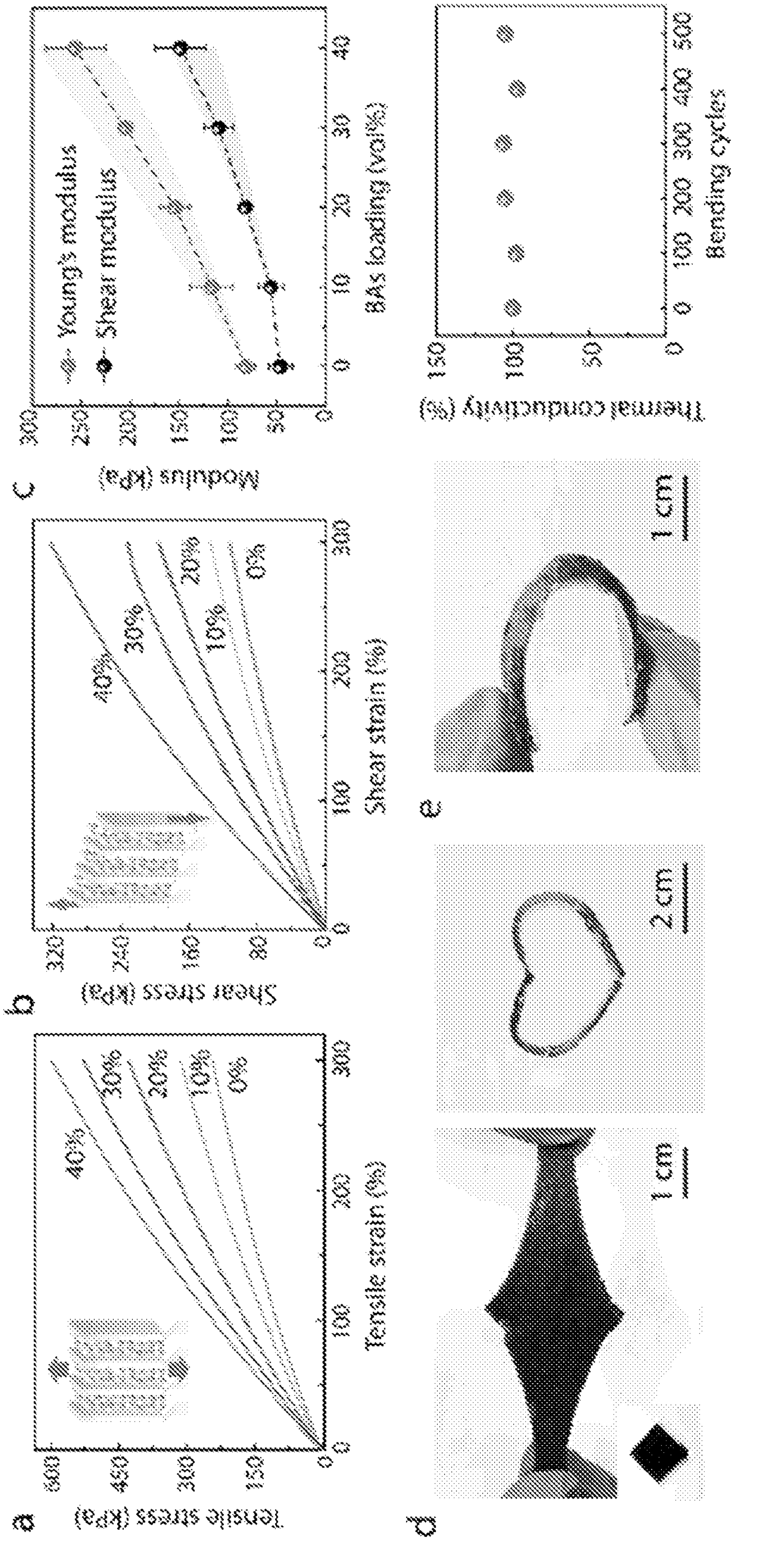
FIG. 3 is a series of illustrations regarding mechanical measurements and high flexibility of s-BAs.

In addition to high thermal conductivity, high mechanical compliance is a desirable property for high-performance thermal interface. The capability of deformability between interfaces leads to the most fundamental engineering requirements, i.e. low elastic modulus to allow shape change and conformal interfacial contact. In addition, concerning the practical application in electronic packagings, a low Young's modulus supports flexible functionality of thermal interfaces in different directions. The Young's modulus and shear modulus measurements of the s-BAs samples were performed with various s-BAs loading ratios from 0 to 40%. The shear modulus was assessed by the lap-shear adhesion test. The representative stress-strain curves from the measurements are shown in FIGS. 3*a* and 3*b*. The Young's modulus and shear modulus were determined by the slope of the loading curve at a nominal strain of 5% and plotted in FIG. 3*c*. These measurement results verify that the s-BAs remains soft with BAs loading volumes up to 40 vol %, with the shear modulus slightly increased from 47 to 148 kPa, and the Young's modulus from 82 to 256 kPa. The s-BAs can support uniaxial strains above 500%, in similar to that of a homogeneous elastomer. These results indicate that the overall BAs/elastomer composite still remains good mechanical compliance. The mechanical properties are also evaluated using finite element method by treating the s-BAs as a composite with the experimental structures. The Young's and shear modulus are determined by computing the structural deformations under applied force along the axial and shear directions, respectively (Methods). As shown in FIG. 3*c*, there is a good agreement between the simulations (shadowed backgrounds) and experiments (solid symbols), indicating the BAs particles are uniformly distributed in the composite.

Further demonstrated is the high flexibility of the s-BAs. As illustrated in FIG. 3*d*, the s-BAs is deformable to support uniaxial strains of more than 500% stretch over its original size. In addition, the s-BAs can be compressed to random geometries such as a heart-shape circle (FIG. 3*d*) without leading to a mechanical breakdown. Such a deformation is impossible for standard thermal interface materials. To further explore the potential application in flexible devices, we have performed thermal measurements of the s-BAs under cyclic mechanical bending of the sample (FIG. 3*e*), thus verifying the preserved high thermal conductivity: The thermal conductivity of the s-BAs sample remains stable over at least 500 bending cycles with a maximum fluctuation within 7%. The persistent high thermal conductivity indicates the robust structures during bending tests, as verified by the cross-sectional SEM images taken after bending cycles. The retention of highly efficient heat dissipation after mechanical bending underscores the promise of using s-BAs for thermal management of flexible devices.

Figure 4:
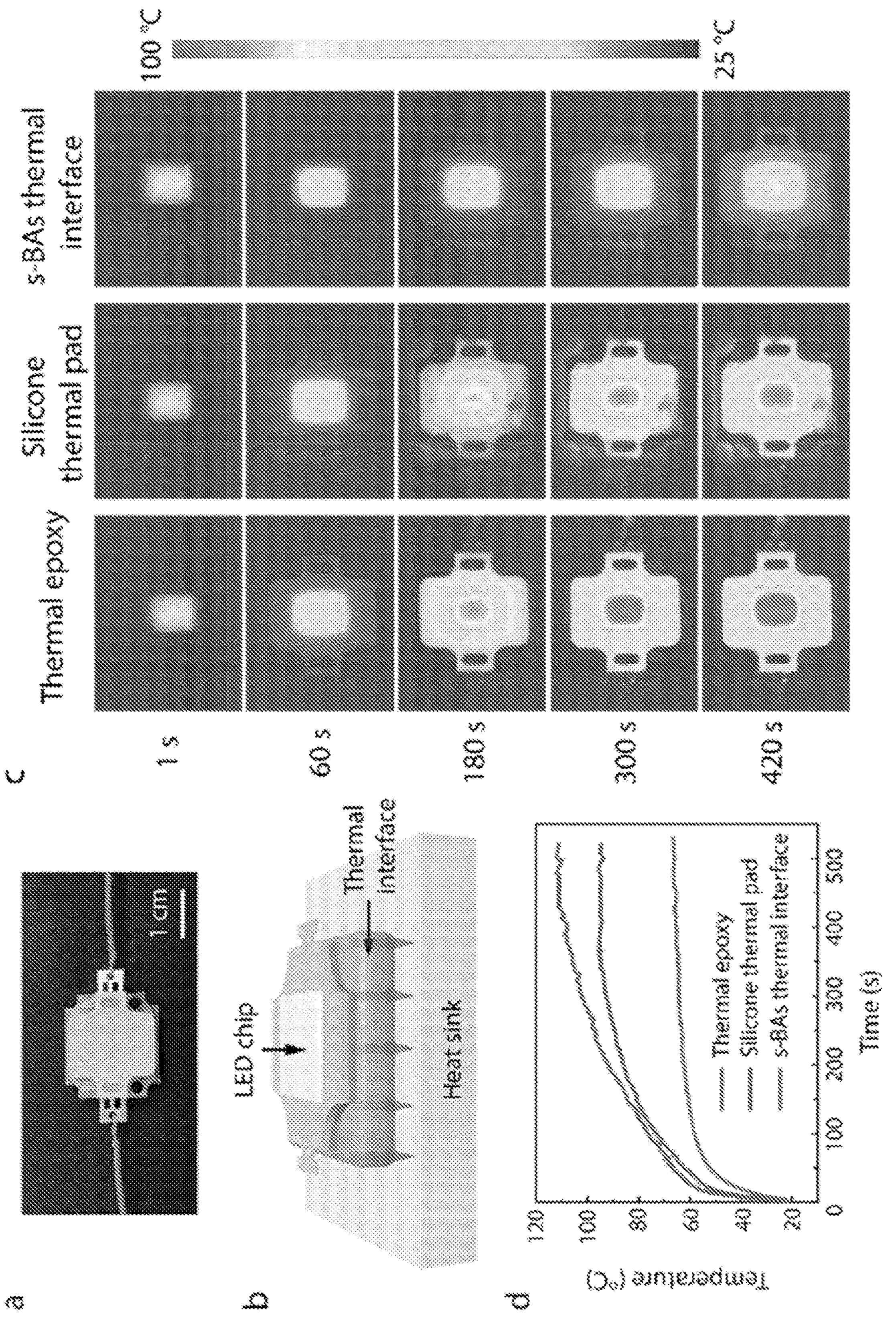
FIG. 4 is a series of illustrations regarding device demonstration of using s-BAs for high-performance thermal management.

As a further step, a proof of concept experiment was conducted to verify the superior device cooling performance of the s-BAs, through the integration and in situ characterizations of a LED during operation (FIG. 4). To make a direct comparison, three types of thermal interfaces, i.e. the commercial thermal epoxy, silicone sheet, and the s-BAs are integrated, sandwiched between a 10 W LED chip and a copper heat sink (FIGS. 4*a* and *b*). Note that all thermal interfaces were chosen to be with the comparable size, thickness etc. An infrared camera was used to record the surface temperature of the LED chips, with the Cu heat sink maintained at the room temperature (23° C.). FIG. 4*c* shows a series of infrared images after lighting up the LED chips, measuring the transient temperature dependence. With thermal epoxy and commercial silicone sheet, the chip surface temperature increased up to approximately 110° C. and 95° C., respectively. In contrast, the stable temperature is much lower (approximately 65° C.) when the BAs composite was used as the thermal interface. Quantitatively, the time-dependent surface temperature of the LED chip was measured based on the infrared images and plotted in FIG. 4*d*, showing a dramatic increase for the devices integrated with thermal epoxy and silicone sheet comparing to that with s-BAs. The large contrast in hot spot temperature difference clearly demonstrates the superior cooling capability of the developed s-BAs for future thermal management applications.

As described above, a high-performance thermal interface material has been fabricated through a scalable self-assembled manufacturing of the recently developed high-thermal conductivity BAs for advanced thermal management. The s-BAs exhibits an unprecedented combination of high thermal conductivity (21 $W \cdot m^{-1} \cdot K^{-1}$) and an excellent elastic compliance similar to that of soft biological tissues (elastic modulus of approximately 100 kPa). The thermal and mechanical experiments described herein, together with multi-physics modeling show that, upon the designed alignment of the BAs crystals in a s-BA, the thermal interface preserves efficient heat transfer paths while maintains the high mechanical compliance of polymer matrix. Moreover, the s-BAs shows highly flexibility that could be applied to emerging applications such as efficient thermal management of flexible electronics and soft robotics.

Methods

Synthesis of cubic BAs crystals. BAs crystals were prepared through chemical vapor transport. High-purity boron and arsenic coarse powders (Alfa Aesar) were ground using mortar and pestle, prior to introduction into a quartz tube at a stoichiometric ratio of 1:2. After loading, the quartz tube was evacuated and flame sealed under high vacuum ($10^{-5}$ Torr), prior to placement into a three-zone furnace for synthesis of at a temperature of about 1033 to about 1058 K. The particle size of the BAs crystals may be controlled using growth conditions and for this work, the size range of BAs crystals is mainly distributed from about 5 to about 10 μm (inset, FIG. 2*b*).

Fabrication of s-BAs polymeric composites. BAs powders were mixed with the solution to yield a BAs aqueous slurry. The slurry was sonicated for 1 hour at 25% power, followed by degassing in a vacuum before use. A plastic tube (10×20×30 mm) was sealed with a copper plate. The BAs aqueous slurry was then poured into the mold, and frozen and directionally assisted by liquid nitrogen. The frozen sample was then taken out from the mold and freeze-dried (pressure: 10 Pa; temperature: −80° C.) for 48 h with a freeze-dryer (Labconco 8811, Kansas City, USA) to leave the BAs as a s-BAs. The epoxy precursor was obtained by uniformly mixing the epoxy resin monomer (EP 862), the curing agents (MHEIPA), with a fixed weight ratio (100/20). The precursor was then infiltrated into the s-BAs and cured at 80 and 120° C. each for 2 hours to form a s-BAs/epoxy composite. The s-BAs samples were prepared and measured using different polymer matrices, including epoxy, polydimethylsiloxane (PDMS), and elastomer (Ecoflex), and all show consistent thermal conductivity results.

Materials structural characterizations. SEM images were obtained with a field-emission SEM instrument (SU-3500, Hitachi). TEM samples were prepared by using a focused ion beam (FIB) machine (Nova 600, FEI). After cleaning, the high angle annular dark field (HAADF) image was taken by using aberration-corrected high-resolution scanning TEM (Grand ARM, JEOL, 300 kV).

Thermal measurements. Specific heat was measured using a differential scanning calorimeter (TA Instruments, 2920) with a temperature increase rate of 5° C./min from room temperature to 100° C. Thermal diffusivity were measured using a standard laser flash setup, where a pulse laser irradiation was used to heat the composites from one side, and time-dependent temperature was recorded at the back end. For laser flash measurement, experimental conditions were carefully designed to ensure reliable analysis. Cross-validation on both thick and thin samples was performed and show consistent measurement results. For thick samples, a large laser heating size and insulated sample boundary were applied, so that the whole sample is uniformly heated up and heat conduction is through the whole cross section making a one-dimensional temperature profile. Meanwhile, the samples were placed in vacuum to avoid the heat loss to the environment. By recording the temperature rise at the rear side, the thermal diffusivity α can be calculated by the following Eq. (1):

$$\alpha = \frac{1.38\, d^2}{\pi^2 t_{0.5}}$$

In Eq. 1, d is the sample thickness, and $t_{0.5}$ is the characteristic time for the sample to heat up to the half of the maximum temperature on its rear surface. The thermal conductivity (κ) can be determined after the measurement of mass density ρ, specific heat $c_p$, and the thermal diffusivity α, following $$\kappa = \alpha \rho c_p \quad \text{Eq. (2)}$$

Thermal images of device temperatures. Transient temperature distributions near the hot spot of LED devices were taken by a calibrated infrared camera (FLIR A655sc). Three comparative thermal interfaces including commercial thermal epoxy, silicone pad, and s-BAs were used. All samples were prepared of the same size and the LED chips were operating under the same conditions. The surface temperatures were calculated directly from the obtained videos and images by using the FLIR Tools+ (FLIR) and Image J (NIH) software packages. All variants of the experiments were performed for at least three different videos, verified with consistent results obtained in each instance.

Thermal modeling. The effective thermal conductivity of the composite materials with varying extents of alignment is modelled by solving the heat conduction equation using finite element method. The positions of BAs particles are distributed using random functions. The extent of alignment is quantified by the standard deviation of BAs particles to the averaged centerline upon alignment. Normal distribution function is used in the direction perpendicular to the alignment. The volume-averaged heat flux density over the whole domain was calculated under a give temperature gradient, and was consequently used to determine the effective thermal conductivity. The thermal conductivity and specific heat used as inputs in this modeling are all measured from the measurement.

Mechanical measurements. Mechanical properties were measured in the tensile mode with an Instron 5542 mechanical tester (Instron Corp, Norwood, MA) with a gauge length of 10 mm at a loading rate of 1 mm/min. All the samples were cut into 30 mm long segments. At least three samples were tested for each experimental condition to obtain statistically reliable values.

Mechanical simulation. The Young's modulus and shear modulus were modeled using finite element method[36] and under the same geometric model as the thermal model. For simulation, one end of the structure is fixed and the other end is applied with force to give the deformation. For the simulation of Young's modulus, a normal force is applied and the axial deformation of the structure is computed. For simulation of the shear modulus, a shear force is applied and the shear deformation of the structure is computed. The effect of alignment of BAs particles on the mechanical properties were examined in the same setting as the thermal modeling, where the extent of alignment is quantified by the standard deviation of BAs particles.

REFERENCES

The following references are noted in the present disclosure above and are incorporated by reference herein in their entirety as though fully set forth herein.

[1] Waldrop, M. The chips are down for Moore's law. Nature 530, 144-147 (2016).
[2] Ball, P. Computer engineering: Feeling the heat. Nature 492, 174-176 (2012).
[3] Kang, J. S. et. al. Experimental observation of high thermal conductivity in boron arsenide. Science 361, 575-578 (2018).
[4] Kang, J. S. et. al. Thermal properties and phonon spectral characterization of synthetic boron phosphide for high thermal conductivity applications. Nano Lett 17, 7507-7514 (2017).
[5] Li, S. et al. High thermal conductivity in cubic boron arsenide crystals. Science 361, 579-581 (2018).
[6] Tian, F. et al. Unusual high thermal conductivity in boron arsenide bulk crystals. Science 361, 582-585 (2018).
[7] Dames, C. Ultrahigh thermal conductivity confirmed in boron arsenid. Science 361, 549-550 (2018).
[8] I.E.A. Digitalization & Energy (International Energy Agency (IEA), 2017).
[9] Jones, N. How to stop data centres from gobbling up the world's electricity. Nature 561, 163-166 (2018).
[10] International Technology Roadmap for Semiconductors (ITRS) 2.0: Executive Report. (Semiconductor Industry Association, Washington, DC, USA 2015).
[11] Eric, M. et. al. Recalibrating global data center energy-use estimates. Science 367, 984-986 (2020).
[12] Rogers, J. A. et al. Materials and mechanics for stretchable electronics. Science 327, 1603-1607 (2010).
[13] Wehner, M. et al. An integrated design and fabrication strategy for entirely soft, autonomous robots. Nature 536, 451-455 (2016).
[14] Someya, T. et. al. The rise of plastic bioelectronics. Nature 540, 379-385 (2016).
[15] Ashcroft, N. W. et al Solid State Physics, 1st Edition. (Cengage Learning, 1976).
[16] Cui, Y. et. al. Emerging interface materials for electronics thermal management: experiments, modeling, and new opportunities. J. Mater. Chem. C 8, 10568-10586 (2020).
[17] Ma., H. et al. A review of mechanical properties of lead-free solders for electronic packaging. J. Mater. Sci. 44, 1141-1158 (2009).
[18] Baur., J. et. al. Challenges and opportunities in multifunctional nanocomposite structures for aerospace applications. MRS Bull. 32, 328-334 (2007).
[19] Winey, K. I. et. al. Improving electrical conductivity and thermal properties of polymers by the addition of carbon nanotubes as fillers. MRS Bull. 32, 348-353 (2007).
[20] Tao, T. et al. Dense vertically aligned multiwalled carbon nanotube arrays as thermal interface materials. EEE Trans. Compon. Packag. Technol. 30, 92-100 (2007).
[21] Baratunde A. et. al. Photoacoustic characterization of carbon nanotube array thermal interfaces. J. Appl. Phys. 101, 054313 (2007).
[22] Marconnet, A. M. et al. Thermal conduction phenomena in carbon nanotubes and related nanostructured materials. Rev. Mod. Phys. 85, 1295-1326 (2013).
[23] Wei, G. et al. Ultracompliant heterogeneous copper—tin nanowire arrays making a supersolder. Nano lett. 18, 3586-3592 (2018).
[24] Bar-Cohen, A. et. al. Nanothermal Interface Materials: Technology Review and Recent Results. J. Electron. Packag. 137, 040803 (2015).
[25] Balandin, A. A. Thermal properties of graphene and nanostructured carbon materials. Nat. Mater. 10, 569-581 (2011).
[26] Bartletta et al. High thermal conductivity in soft elastomers with elongated liquid metal inclusions. Proc. Natl. Acad. Sci. U.S.A. 114, 2143-2148 (2017).
[27] Bubnova, O. Thermal release. Nat. Nanotechnol. 13, 620 (2018).
[28] Broido, L. L. et. al. First-principles determination of ultrahigh thermal conductivity of boron arsenide: a competitor for diamond? Phys. Rev. Lett. 111, 025901 (2013).
[29] Feng, T., et. al. Four-phonon scattering significantly reduces intrinsic thermal conductivity of solids. Phys. Rev. B 96, 161201 (2017).
[30] Fan, H. et. al. Ab initio investigation of single-layer high thermal conductivity boron compounds. Phys. Rev. B 100, 085420 (2019).
[31] Wu, H. et. al. Ab initio determination of ultrahigh thermal conductivity in ternary compounds. Phys. Rev. B, DOI:10.1103/PhysRevB.00.001200.
[32] Kang, J. S. et. al. Basic physical properties of cubic boron arsenide. Appl. Phys. Lett. 115, 122103 (2019).
[33] Li, M. et al. Anisotropic thermal boundary resistance across 2D black phosphorus: experiment and atomistic modeling of interfacial energy transport. Adv. Mater. 31, e1901021 (2019).
[34] Xiong, Y. et al. Ultralow thermal conductance of the van der Waals interface between organic nanoribbons. Mater. Today Phys. 11, 100139 (2019).
[35] Huang, Y. W. et. al. Reduction of interfacial thermal resistance of overlapped graphene by bonding carbon chains. Chin. Phys. B 29, 126303 (2020).
[36] Plawsky, J. L. Transport Phenomena Fundamentals. (CRC Press, 2014).
[37] Deville, S. et. al. Freezing as a path to build complex composites. Science 311, 515-518 (2006).

[38] Zhang, H. et al. Aligned two- and three-dimensional structures by directional freezing of polymers and nanoparticles. Nat. Mater. 4, 787-793 (2005).

[39] Han, J. et. al. An anisotropically high thermal conductive boron nitride/epoxy composite based on nacre-mimetic 3D network. Adv. Funct. Mater. 29, 1900412 (2019).

[40] Standard Test Method for Thermal Diffusivity by the Flash Method. (ASTM International, West Conshohocken, PA, 2013).

The following are example applications of the present disclosure.

1) Thermal applications. Any materials processing or integration to use boron arsenide-based thermal interface materials to in direct or indirect contact with a heating source to conduct or collect heat is considered for these applications. Examples including computer, mobile devices or any circuits heat dissipation or conduction. In addition, thermal applications using boron arsenide-based thermal interface materials for thermal energy conversion, storage, or thermal management is considered for this patent. In all hierarchical electronic systems ranging from nanoscale transistors, smart phones, laptops, vehicle electronics, to data server farms, waste heat dissipates from the hot spots to heat sink across a series of thermal resistance of multiple device layers and their interfaces. As a result, the device performance, reliability, and energy efficiency can be strongly degraded by a large thermal resistance and a rising hot spot temperature. Current technologies use thermal greases, gels, pads, tapes, conductive adhesives, phase change materials, metallic solders as interface materials. However, instead of traditional thermal interface materials, BAs-based materials can serve more effective thermal interface because its high-performance thermal interfaces with the combination of low elastic modulus, large flexibility, and high thermal conductivity.

2) Electronics and robotics devices. This study demonstrates scalable manufacturing of a new generation of energy-efficient and flexible thermal interface that holds great promise for advanced thermal management of future integrated circuits and emerging applications such as wearable electronics (transistors, sensors, circuits, memories, etc.) and soft robotics (surgical assistance robotics, flexible exosuits robotics, collaborative robots, bio-mimicry robotics, etc.).

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms “comprising,” “including,” “containing,” etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase “consisting essentially of” will be understood to include those elements specifically recited and those additional elements that do not materially affect the basic and novel characteristics of the claimed technology. The phrase “consisting of” excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions, or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as “up to,” “at least,” “greater than,” “less than,” and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A thermal interface comprising a polymer composite comprising a polymer and a cubic boron arsenide, wherein the thermal interface exhibits an elastic modulus from about 90 kPa to about 5 GPa.

2. The thermal interface of claim 1, wherein the polymer is a thermoplastic or thermoset polymer.

3. The thermal interface of claim 1, wherein the polymer comprises an elastomer, an epoxy, a silicone, a polyethylene, a polyester, or a polytetrafluoroethylene.

4. The thermal interface of claim 1, wherein the thermal interface exhibits a thermal conductivity of greater than about 20 W $m^{-1}$ $K^{-1}$.

5. The thermal interface of claim 1, wherein the thermal interface exhibits a thermal conductivity from about 1 W $m^{-1}$ $K^{-1}$ to about 50 W $m^{-1}$ $K^{-1}$.

6. The thermal interface of claim 1, wherein the thermal interface exhibits a shear modulus from about 40 kPa to about 200 kPa, according to ASTM E143.

7. The thermal interface of claim 1, wherein the thermal interface exhibits a shear modulus from about 40 kPa to about 150 kPa, according to ASTM E143.

8. The thermal interface of claim 1, wherein the thermal interface exhibits a Young's modulus from about 75 kPa to about 400 kPa, according to ASTM E111.

9. The thermal interface of claim 1, wherein the thermal interface exhibits a shear modulus from about 80 kPa to about 300 kPa.

10. A device comprising a chip, a heat sink, and thermal interface comprising a polymeric composite of a polymer and a cubic boron arsenide, wherein the thermal interface exhibits an elastic modulus from about 90 kPa to about 5 GPa.

11. The device of claim 10, wherein the polymer is a thermoplastic or thermoset polymer.

12. The device of claim 10, wherein the polymer comprises an elastomer, an epoxy, a silicone, a polyethylene, a polyester, or a polytetrafluoroethylene.

13. The device of claim 10, wherein the thermal interface exhibits a thermal conductivity of greater than about 20 W $m^{-1}$ $K^{-1}$.

14. The device of claim 10, wherein the thermal interface exhibits a thermal conductivity from about 1 W $m^{-1}$ $K^{-1}$ to about 50 W $m^{-1}$ $K^{-1}$.

15. A process of forming a cubic boron arsenide polymer composite, the process comprising, suspending boron arsenide particles in water as a slurry in a mold, applying a directional temperature gradient to the mold to freeze the slurry as a frozen slurry, freeze-drying the frozen slurry to obtain a cubic boron arsenide material, and introducing a polymer melt to the cubic boron arsenide material to form the cubic boron arsenide polymer composite.

16. The process of claim 15, wherein the polymer melt comprises a thermoplastic or thermoset polymer.

* * * * *